United States Patent
Schulz-Harder et al.

[11] Patent Number: 6,093,443
[45] Date of Patent: Jul. 25, 2000

[54] PROCESS FOR PRODUCING A CERAMIC-METAL SUBSTRATE

[75] Inventors: Jurgen Schulz-Harder, Lauf; Karl Exel, Rimbach/Odw., both of Germany

[73] Assignee: Curamik Electronics GmbH, Germany

[21] Appl. No.: 09/190,619

[22] Filed: Nov. 12, 1998

[30] Foreign Application Priority Data

Nov. 12, 1997 [DE] Germany ............................ 197 50 016
Nov. 29, 1997 [DE] Germany ............................ 197 53 149

[51] Int. Cl.⁷ .................................................... B05D 5/12

[52] U.S. Cl. ............................ 427/97; 205/125; 205/126; 204/224; 204/228; 204/920

[58] Field of Search .................................. 205/125, 126; 204/224, 228, 920; 427/97; 174/256, 262, 266

[56] References Cited

U.S. PATENT DOCUMENTS

| | | | |
|---|---|---|---|
| 3,350,498 | 10/1967 | Leeds | 174/68.5 |
| 3,475,284 | 10/1969 | Olson | 204/15 |
| 4,325,780 | 4/1982 | Schulz, Sr. | 156/659.1 |
| 4,964,923 | 10/1990 | Takeuchi et al. | 148/276 |

*Primary Examiner*—Kathryn Gorgos
*Assistant Examiner*—Christopher M. Keehan
*Attorney, Agent, or Firm*—Hoffman, Wasson & Gitler

[57] ABSTRACT

The invention relates to a novel process for producing a copper ceramic substrate with at least one through-plated hole, with a ceramic layer which has at least one opening for the through-plating, on one surface side is provided with a first metal coating and on the opposite surface side with a second metal coating which extends into at least one opening and is connected to the first metal coating, for formation of the first metal coating a copper foil being applied by DCB technique to one surface side of the ceramic layer.

20 Claims, 6 Drawing Sheets

PROCESS FOR PRODUCING A CERAMIC-METAL SUBSTRATE

BACKGROUND OF THE INVENTION

The invention relates to a process for producing a copper ceramic substrate with at least one through plated hole.

Producing a metal coating on a ceramic is known, for example on an aluminum oxide ceramic using the DCB (direct copper bond technology) process. This type of coating is required for the production of printed conductors, terminals, etc. Metal or copper foils, or metal or copper sheets, which form the substrate coating on the desired device, are applied as a coating (fusing layer) composed of a chemical compound of the metal and a reactive gas, preferably oxygen onto a side of the device's substrate. In this process, described for example in U.S. Pat. No. 37 44 120 or in DE-PS 23 19 854, this layer or this coating (fusing layer) forms a eutectic with a melting point below the melting point of the metal (for example, copper) so that by placing a foil on the ceramic and by heating all the layers they can be joined to one another by fusing the metal or copper exclusively in the area of the fusing layer, or the oxide layer.

This DCB process includes the following process steps:

oxidation of a copper foil such that a uniform copper layer results;

placing a copper foil on the ceramic layer;

heating the composite to a process temperature between roughly 1065 to 1083° C., for example to roughly 1071° C.;

cooling to room temperature;

The object of the invention is to provide a process with which it is possible to produce metal-ceramic substrates for electrical circuits economically and reliably, with at least one through-plated hole.

SUMMARY OF THE INVENTION

The process as claimed in the invention allows production of ceramic-metal substrates and especially ceramic-copper substrates for electrical circuits in an economical and reliable form, with through-plated holes. Surprisingly, it is possible in the invention to effect the respective contact by connecting the metal coating formed by a copper film, and provided on one side of the ceramic layer, by means of DCB technology to the galvanically precipitated second metal coating in the area of at least one opening which forms the through-plated hole.

BRIEF DESCRIPTION OF THE DRAWINGS

The invention is detailed below using the following FIGS.

DETAILED DESCRIPTION OF THE INVENTION

EXAMPLE I

Figure 1:
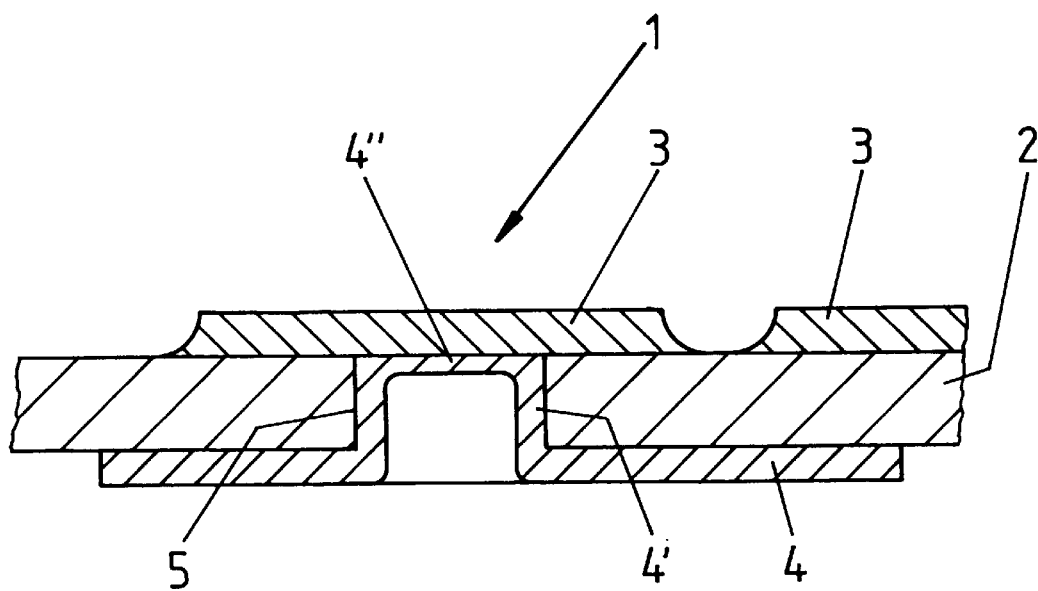
FIG. 1 shows a ceramic-copper substrate with a through-plated hole, produced using the process as claimed in the invention.

The substrate labelled 1 in FIG. 1 includes a ceramic layer 2 which is, for example, a layer or a thin plate of aluminum oxide ceramic ($Al_2O_3$). On the top of layer 2, a first metal coating 3 is applied in the form of a copper plate, or foil, which is structured in a suitable manner to form printed conductors and/or contact surfaces. On the bottom of the ceramic layer 2, there is a second metal coating 4, which is produced in the manner detailed below by chemical and subsequent galvanic precipitation of metal and which is made up of copper in the embodiment shown.

The ceramic layer 2 has at least one through opening 5 in which the metal coating 4 is likewise formed, i.e. the metal coating 4 is provided on the inside surface of the opening 5 (section 4' of the metal coating 4) and on the area of the area of the metal coating 3 which bridges the opening 5 (section "4" of the metal coating 4). The section 4" and the metal coating 3 are connected to one another in the manner detailed below by DCB technology so that the sections 4' and 4" of the metal coating 4 form a through-plated hole for the metal coating 3. The opening 5 has, for example, a diameter which is roughly between 0.3D and 10D, D being the thickness of the ceramic layer 2.

As FIGS. 2–12 show, the substrate 1 is produced according to this example 1, by the following process steps.

Process step 1:

First the ceramic layer 2 is produced with at least one opening 5, for example, by means of a laser beam, for example, with a $CO_2$ laser.

Process step 2:

After producing at least one opening, the ceramic layer 2 is cleaned, first mechanically cleaned for removal of the particles (laser slag) formed during production of at least one opening 5. Cleaning in distilled water, using ultrasound, usually follows.

Figure 2:
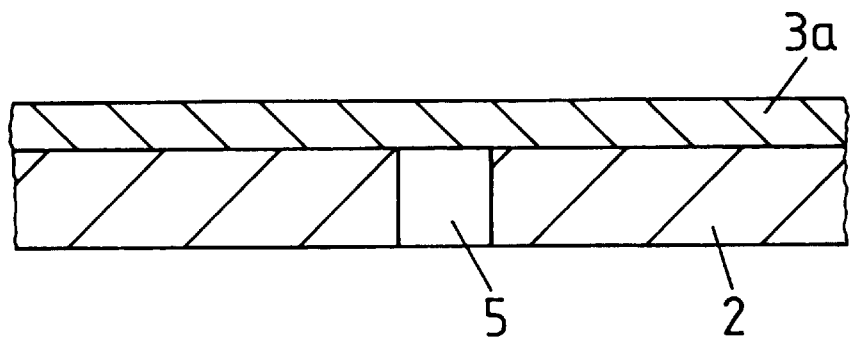
FIGS. 2–12 show different process steps for producing the substrate of FIG. 1.

Process step 3:

A copper foil 3a, which forms the metal coating 3, and which is oxidized on its surface sides, the oxide layer being roughly 0.1 to 0.8 mm, is placed on the cleaned ceramic layer 2 and joined to it using the DCB technique, i.e. by heating to a temperature between 1025–1083° C. (FIG. 2).

Figure 3:
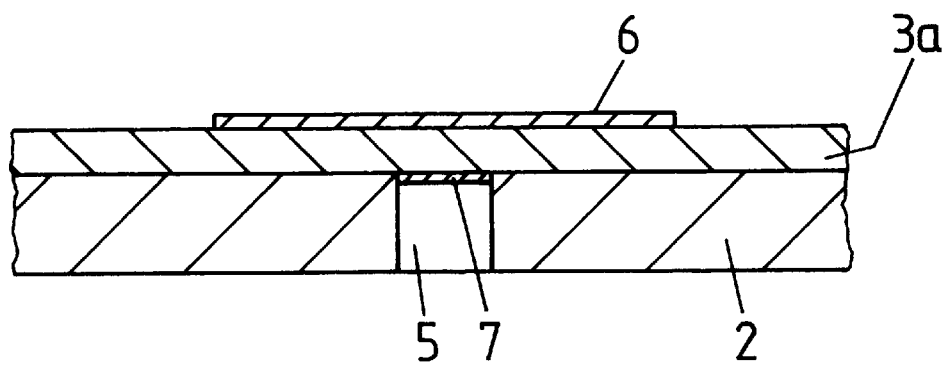

Process step 4:

In the subsequent process steps, first structuring of the copper foil 3a is done to achieve the structured metal coating 3. For this reason, the copper foil 3a applied to the ceramic layer 2 is provided with a layer 6 of an etching resistant material where the copper foil 3a is to remain to form the structured metal coating 3 on the top of the substrate 1. Likewise the copper layer 3a is covered in the area of the opening 5 by a layer 7 of etching resistant material. (FIG. 3).

Figure 4:
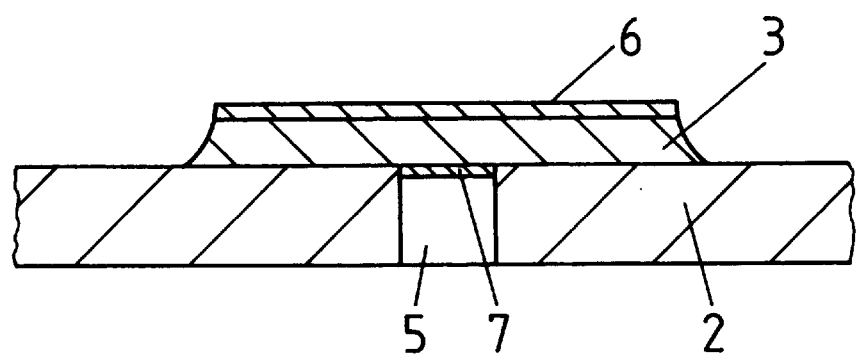
Figure 5:
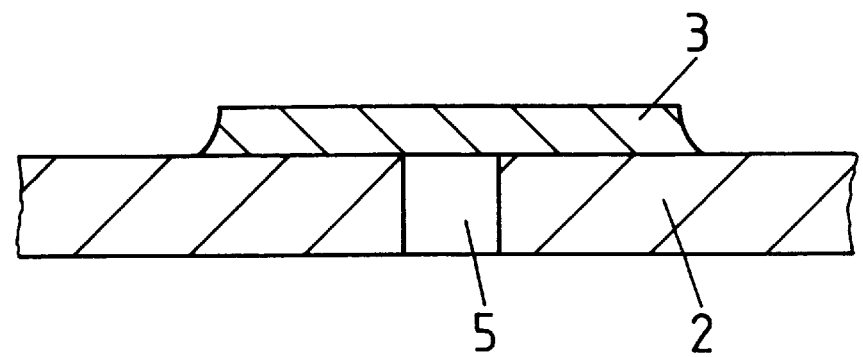

Process step 5:

In another process step, etching of the copper layer 3a takes place on the areas not covered by layers 6 and 7 (FIG. 4). The layers 6 and 7 are then removed so that ultimately the arrangement as reproduced in FIG. 5 is achieved, which includes the ceramic layer 2 and the structured metal coating 3.

Process step 6:

In another process step, a thin metal coating is chemically applied to the entire arrangement in the form of a thin metal layer 8 which covers the top of the ceramic layer 2 and the structured metal coating 3 and in the form of a thin metal layer 9 which covers the entire bottom of the ceramic layer 2, the entire inner surface of at least one opening 5 and also the surface of the metal coating 3 which is exposed in the area of this opening.

Figure 6:
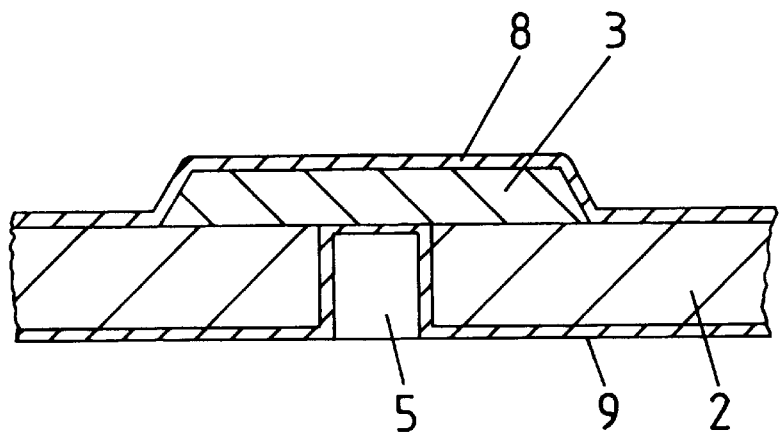

The chemically produced or applied metal layers 8 and 9, which have, for example, a thickness of roughly 0.1 to 10 microns, are, for example, copper layers. It is also possible to produce the layers 8 and 9 by chemical precipitation of silver, the layer thickness here in turn being roughly between 0.1 to 10 microns. (FIG. 6).

Figure 7:
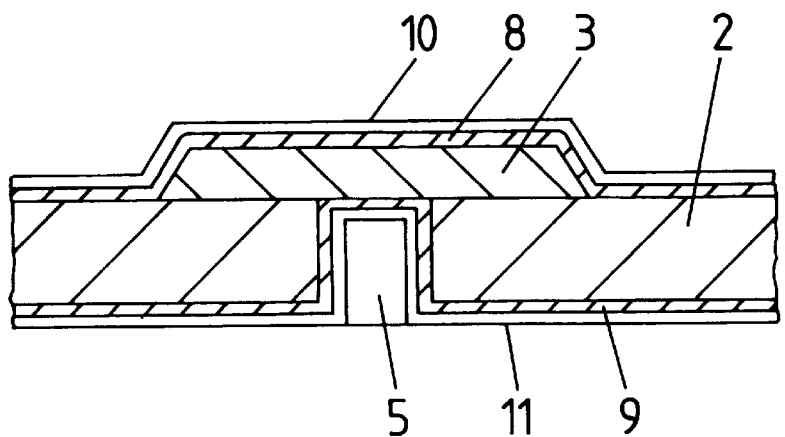

Process step 7:

In another process step, the blank produced in this way on the top and bottom is provided with a layer 10 and 11 of a photoresist (FIG. 7).

Figure 8:
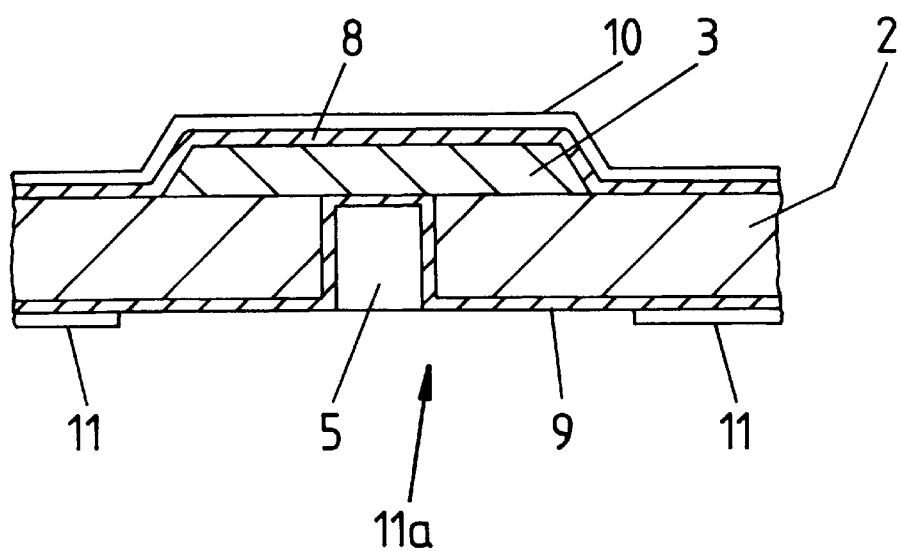

The photoresist is exposed in a suitable manner and developed such that this process removes the photoresist layer 11, provided on the bottom in an area 11a which adjoins the opening 5, so that in this area or window 11a the thin metal layer 9 is exposed, especially in that part in which the metal layer 9 extends in the opening 5 (FIG. 8).

Figure 9:
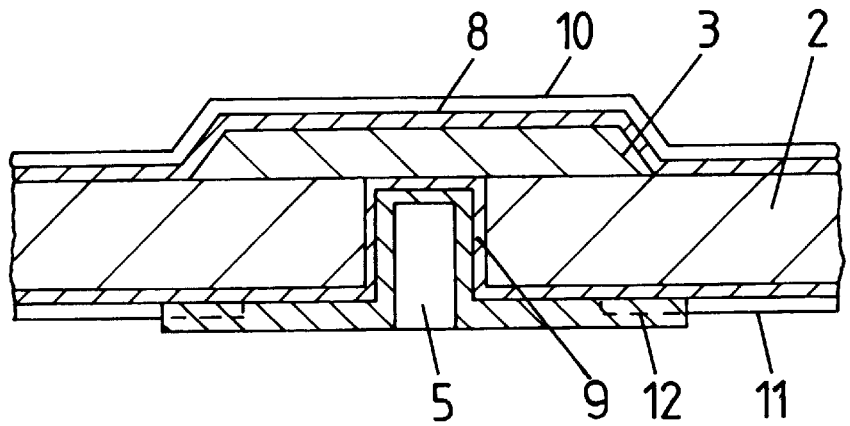

Process step 8:

In another process, at this point the metal layer 9 which is exposed in the window 11a is reinforced by a copper layer 12 of greater thickness being precipitated galvanically on this metal layer (FIG. 9).

Figure 10:
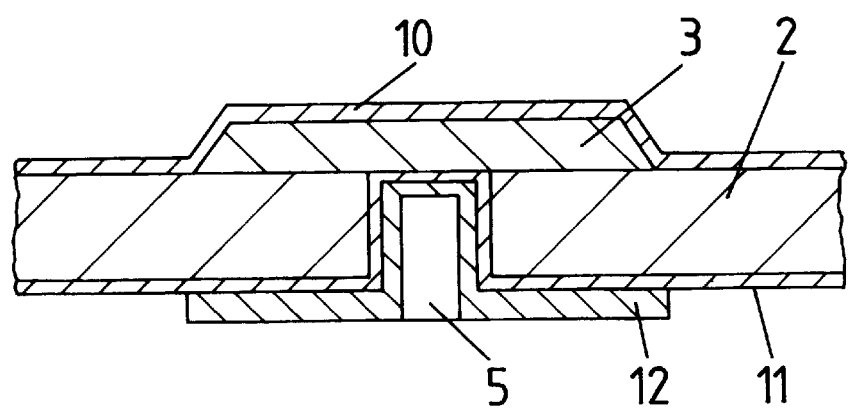

Process step 9:

In another process step, the layers 10 and 11 of photoresist are completely removed so that the arrangement shown in FIG. 10 is obtained in which the ceramic layer 2 on its top has the structured metal coating 3 and the thin metal layer 8 which covers this metal coating, but also the ceramic surface outside of the metal coating 3, and on the bottom of the ceramic layer 2 there is a thin metal coating 9 which in the area of the opening 5 is reinforced by the galvanically applied copper layer 12. The copper layer 12 has for example a thickness between 10 and 100 microns.

Process step 10:

In another process step, the thin metal layer 8 on the top of the ceramic layer 2 and also the thin metal layer 9 on the bottom of the ceramic layer 2 are removed, and specifically the metal layer 9, if it is not covered by copper layer 12. This removal is carried out by an etching process which can be accomplished due to the small layer thickness of the metal layers 8 and 9, without a noticeable reduction of the thickness of the copper layer 12 (FIG. 11).

Figure 11:
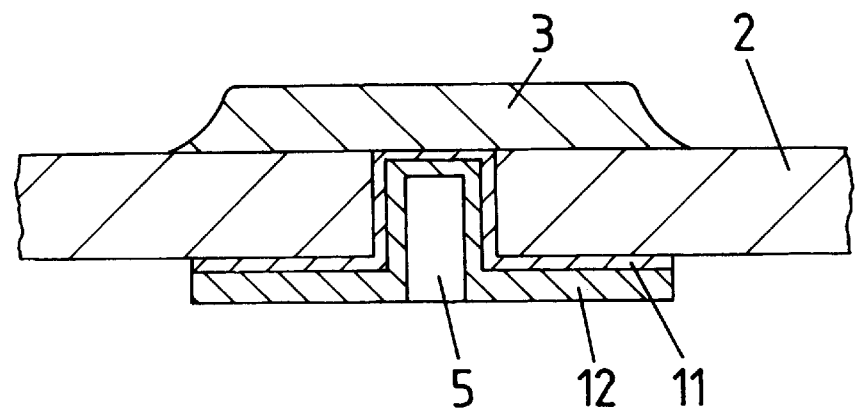
Figure 12:
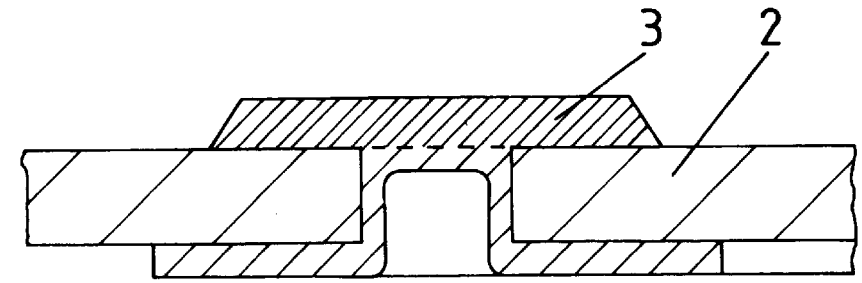

Process step 11:

In another process step, the structure of FIG. 11 is heated in a protective gas atmosphere of N2 or Ar, with a small portion of oxygen (for example, 2–150 ppm $O_2$) to roughly 1050 to 1083° C., by which in the area of the opening 5, surprisingly, a connection using the DCB process is produced between the lower metal coating 4 which was first produced by chemical precipitation and subsequent galvanic strengthening, and the upper structured metal coating 3 from copper foil 3a (FIG. 12).

In another embodiment of the process, as claimed in the invention, after chemical precipitation of the copper metal layers 8 and 9, oxidation of these layers takes place with 1 to 10% of their thickness, before reinforcing the lower layer 9 in the area of the window 11a, i.e. before galvanic application of the copper layer 12. This oxidation has the advantage that the oxygen required for the aforementioned process step 11 is present directly "on site" so that a DCB connection is obtained between the lower metal coating 4 and the upper structured metal coating 3 in the area of the respective opening 5.

EXAMPLE II

Figure 13:
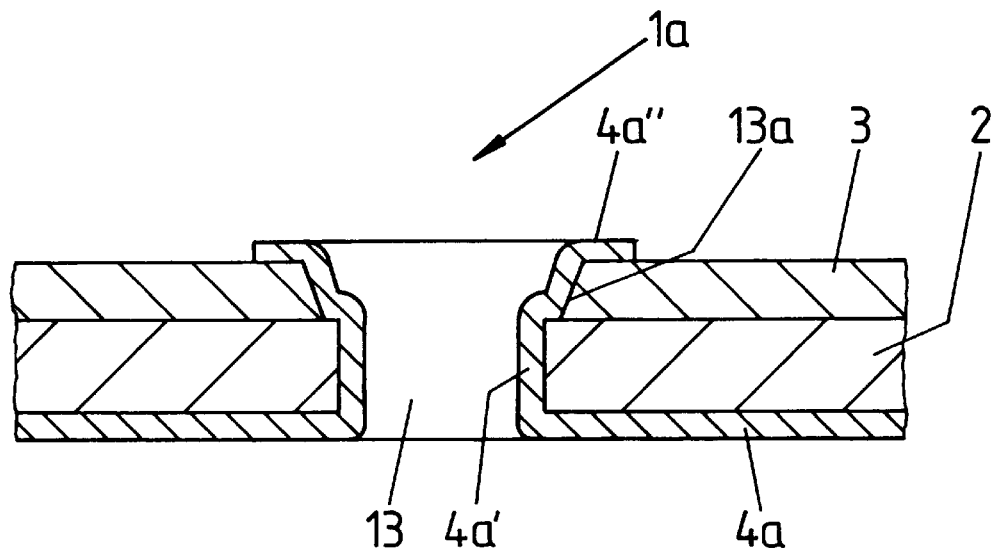
FIG. 13 shows in a view similar to FIG. 1 another possible embodiment of the ceramic-copper substrate as claimed in the invention with a through-plated hole.

FIG. 13 shows in a representation similar to FIG. 1, an alternate embodiment of the invention. A substrate 1a, includes a ceramic layer 2, for example, of aluminum oxide ceramic, with a first metal coating 3 applied to one of its surface sides. The first metal coating, such as a copper foil, is applied using the DCB technique. On the bottom of the ceramic layer 2 is a second metal coating, which is produced in the manner described below, by chemical and subsequent galvanic precipitation of metal, and in the embodiment shown, is made essentially of copper. In the ceramic layer 2, and in the metal coating 3, in this embodiment, there is a continuous opening 13 which forms a through-plated hole, for which the metal coating 4a is inserted into the opening 13 and there with section 4a' covers the inner surface of the opening 13 and extends with a section 4a" over the metal coating 3 in an area which surrounds the opening 13 and is securely connected to this metal coating 3 using DCB technology.

For producing the substrate 1a, a process is used which among others has the process steps described in FIGS. 14–18, but in part also process steps, as was described above in example 1 in conjunction with FIGS. 2–12 for the substrate 1.

In particular the substrate 1a is produced in the following process steps:

Process step 1:

First, the ceramic layer 2 is cleaned, for example, by flushing in water, optionally with ultrasonic support.

Figure 14:
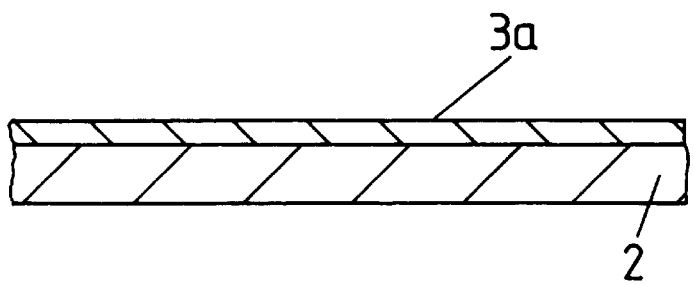
FIGS. 14–18 show different process steps for producing the substrates of FIG. 13.

Process step 2:

A copper foil 3a which forms the metal coating 3 and which is oxidized on its surface sides, with an oxide layer, for example, from roughly 0.1 to 0.8 mm, is placed on the cleaned ceramic layer and is joined to it using DCB technology, i.e. by heating to a temperature between 1025–1083° C. (FIG. 14).

Process step 3:

In subsequent process steps, structuring of the copper foil 3a is done to achieve a structured metal coating 3. For this reason, a layer 6 of etching resistant material is applied to the copper foil 3a which has been applied to the ceramic layer 2, where the copper foil 3a is to remain to form the structured metal coating 3 on the top of the substrate. The etching resistant material is applied such that the area of the opening 13 to be provided later remains free of the etching resistant material (FIG. 15).

Figure 15:
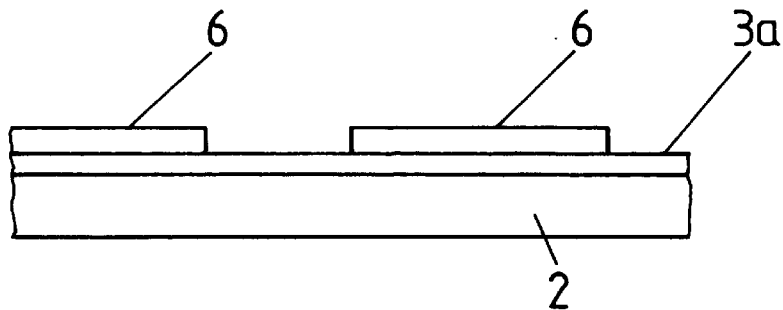
Figure 16:
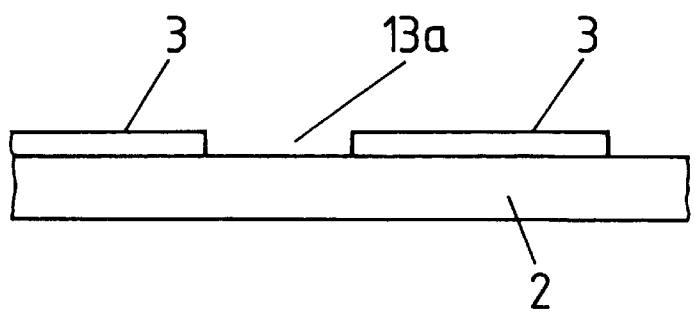

Process step 4:

In another step, the copper layer 3a is etched on the areas not covered by the etching resistant layer 6 so that a structured metal coating 3 is obtained in which there is already an opening 13a for later formation of the opening 13 (FIG. 15). Layer 6 is then removed so that ultimately the arrangement reproduced in FIG. 16 is obtained which contains a ceramic layer 2 or the structured metal coating 3 in which there is also an opening 13a.

Process step 5:

In the next process step, the ceramic layer 2 is provided in the area of the prepared opening 13a with an opening 13, for example by means of a laser beam, such as by a C02 laser.

Figure 17:
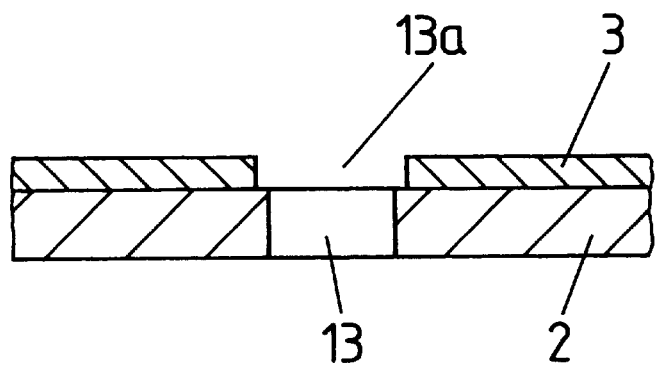

After producing the opening 13, the arrangement including the ceramic layer 2 and the metal coating 3 is cleaned, first by mechanical cleaning to remove the particles formed in the production of the opening 13 (for example, laser slag, etc.), and then by cleaning in distilled water using ultrasound, so that ultimately, the arrangement, shown in FIG. 17, is obtained.

Process step 6:

Analogously to the process step 6 of example I, in another process step, a chemically thin metal coating is applied in the form of thin metal layers 8 and 9 applied to the entire arrangement, especially in the area of the wall of the opening 13a, i.e. the chemically produced metal layer 9 extends through the opening 13 on the peripheral surface of this opening as far as the top of the arrangement and there passes into the thin metal coating 8 which covers the top of the ceramic layer 2 and the metal coating 3. The chemically produced or applied metal layers 8 and 9 have, for example, a thickness on the order of 0.1 to 10 microns and are copper layers. Here, as well, it is fundamentally possible to produce the layers 8 and 9 by chemical precipitation of silver, the layer thickness being roughly between 0.1 and 10 microns.

Figure 18:
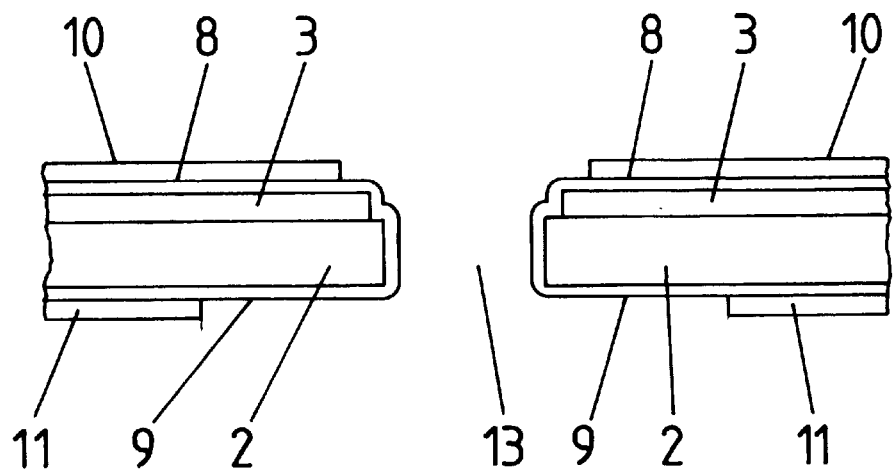

Process step 7:

Analogously to the process step 7 of example I, in this further process step, the blank or the arrangement on the top and bottom is provided with a layer 10 and 11 of photoresist. This photoresist is then exposed and developed in a suitable manner such that the photoresist is removed on the bottom of the ceramic layer 2, or in an area which surrounds the opening 13 there, but also within the opening 13, on the edge area of the ceramic layer 2 surrounding the opening 13 and on the area of the metal coating 9 surrounding the opening 13, so that the thin metal layers 8 and 9 are exposed on these areas on which the photoresist has been removed (FIG. 18).

Process step 8:

In another process step, the exposed areas of the metal layers 8 and 9 not covered by the photoresist are reinforced by galvanic application of a copper layer of greater thickness (for example, a thickness between 10 and 100 microns) so that a metal layer 4a with its sections 4a' and 4a" is obtained on the areas of the thin metal coatings 8 and 9 not covered by the photoresist.

Process step 9:

Analogously to process step 9 of example I, the photoresist is completely removed and subsequently the metal layers 8 and 9 are also completely removed by an etching process where they are not covered by the galvanically applied copper layer.

Process step 10:

In another process step, analogous to process step 11 of example I, in a protective gas atmosphere of $N_2$, or Ar, with a small portion of oxygen (for example, 2–150 ppm $O_2$), and by heating to roughly 1050 to 1083° C., the connection of the galvanically precipitated copper layer, or the sections 4a', to the structured metal coating 3, takes place using a DCB process.

In example II as well, after chemical precipitation of the metal layers 8 and 9, which are made of copper, oxidation at least of the metal layer 8 with 1 to 10% of its thickness can be done, before galvanic precipitation of the strengthening copper layer. This oxidation in turn has the advantage that the oxygen required for the aforementioned process step 10 is directly present on site.

The version as claimed in example II has, among others, the additional advantage of an especially flexible configuration of the production run, since for this process ceramic materials can be used as are required in the production of the copper-ceramic substrates without through plating.

The aforementioned chemical application of the metal layers 8 and 9 as thin silver layers in the two versions has the advantage that the temperature for the second DCB process (in process step 11) can be reduced and, in addition, improved welding of the copper which forms the structured metal coating 3 with the copper of the galvanically precipitated layer 12 is achieved.

The invention was described above on by representative embodiments. It goes without saying that numerous modifications and changes are possible without departing from the inventive idea underlying the invention.

| Reference number list | |
| --- | --- |
| 1 | metal-ceramic substrate |
| 2 | ceramic layer |
| 3 | structured metal coating |
| 3a | copper foil |
| 4 | metal coating |
| 4', 4" | area of the metal coating 4 |
| 5 | opening |
| 6, 7 | layer of etching resistant material |
| 8, 9 | metal layer |
| 10, 11 | photoresist layer |
| 11a | window |
| 12 | strengthened copper layer |

What is claimed is:

1. A process for producing a copper ceramic substrate with at least one through-plated hole, having a ceramic layer which has at least one opening for through-plating, on one surface side of the ceramic layer is provided a first metal coating and on an opposite surface side of the ceramic layer is provided a second metal coating which extends into the at least one opening and is connected to the first metal coating, application of the first metal coating to one surface side of the ceramic layer is done by direct copper bonding, further comprising the steps of:

applying the second metal coating layer as a thin auxiliary metal layer, by chemical precipitation, such that the thin auxiliary metal layer extends into the at least one opening and reaches as far as the first metal coating;

the thin auxiliary metal layer is selectively reinforced by applying or precipitating a reinforced copper layer thereon;

the thin auxiliary metal layer is then removed on areas not covered by a reinforced copper layer placed thereon; and then heating in an inert gas atmosphere at a temperature ranging from 1025° C. to 1083° C. to form a connection between the first metal coating and the second metal coating by means of direct copper bonding.

2. A process for producing a copper ceramic substrate which has at least one through-plated hole, comprising the steps of:

a) applying by direct copper bonding a first metal layer onto an entire surface side of a substrate and a second metal layer onto an opposite side of the substrate, the substrate having at least one opening to form a composite;

b) providing on at least a surface side of the composite, wherein the second metal layer is a thin auxiliary metal layer which extends into the at least one opening and reaches as far as the first metal layer;

c) selectively reinforcing the thin auxiliary metal layer at least in the one opening by application of a galvanic copper layer;

d) removing the thin auxiliary metal layer which is not reinforced by the galvanic copper layer by etching; and e) heating in an inert gas atmosphere at a temperature ranging from approximately 1025° C. to 1083° C. so that a connection is formed between the first metal layer and the second metal layer by direct copper bonding.

3. The process as claimed in claim 2, wherein the thin auxiliary metal layer is applied to at least one partial area of the first metal coating.

4. The process as claimed in claim 2, wherein the thin auxiliary metal layer on the second metal layer is reinforced by application of a copper layer having a thickness greater than that of the thin auxiliary metal layer at least in an area around the at least one opening.

5. The process as claimed in claim 4, wherein the application of the copper layer which reinforces the thin auxiliary metal layer also takes place on a partial area of the first metal layer.

6. The process as claimed in claim 2, wherein a copper foil which forms the first metal coating is applied by means of direct copper bonding to the substrate already provided with at least one opening, and wherein a reinforcing copper layer is applied in an area of the at least one opening to the surface of the first metal coating exposed in this at least one opening.

7. The process as claimed in claim 6, wherein the reinforcing copper layer is selectively applied using a masking technique.

8. The process as claimed in claim 2, wherein a copper foil which forms the first metal coating after application to the substrate and before precipitation of the thin metal auxiliary layer is structured by masking and etching.

9. The process as claimed in claim 8, wherein masking takes place after application of the thin auxiliary metal layer and before reinforcing of the auxiliary metal layer provided on the second metal layer using a photoresist, exposure and developing.

10. The process as claimed in claim 2, wherein the thin auxiliary metal layer is applied with a thickness ranging between 0.1 and 10 microns.

11. The process as claimed in claim 2, wherein the galvanic copper layer is applied electrolytically.

12. The process as claimed in claim 2, wherein the galvanic copper layer is applied with a thickness ranging from approximately 10 to 100 microns.

13. The process as claimed in claim 2, wherein the thin auxiliary metal layer provided on the second metal layer is oxidized before reinforcement.

14. The process as claimed in claim 13, wherein oxidation occurs in from 1 to 10% of the thickness of the thin auxiliary metal layer.

15. The process as claimed in claim 2, wherein the thin auxiliary metal layer is copper or silver.

16. The process as claimed in claim 2, wherein the first metal coating is structured before applying the thin auxiliary metal layer.

17. The process as claimed in claim 2, wherein the at least one opening is produced for at least one through-plated hole only after applying a copper foil which forms the first metal coating to the substrate, whereby selective removal of the first metal coating in the area of the at least one through-plated hole occurs, and wherein before applying the thin auxiliary metal layer and reinforcing it, the at least one opening is made in the ceramic layer.

18. The process as claimed in claim 17, wherein the at least one opening is made by a mechanical process or a laser process.

19. The process as claimed in claim 17, wherein structuring of the first metal coating takes place in the area of the at least one through-plated hole by etching, masking, or by a mechanical process.

20. The process as claimed in claim 2, wherein the first metal layer is made up of a copper foil which is already provided with the at least one opening necessary for the through plating in the first metal coating.

* * * * *